United States Patent [19]

Ohtsuka et al.

[11] Patent Number: 5,498,993
[45] Date of Patent: Mar. 12, 1996

[54] PULSE LIGHT-RECEIVING CIRCUIT WITH MEANS TO MINIMIZE POWER SOURCE NOISE

[75] Inventors: Yoshihiro Ohtsuka, Nara; Yoshihumi Masuda, Kashihara, both of Japan

[73] Assignee: Sharp Kabushiki Kaisha, Japan

[21] Appl. No.: 180,335

[22] Filed: Jan. 12, 1994

[30] Foreign Application Priority Data

Jan. 27, 1993 [JP] Japan .................................. 5-011815
Jun. 22, 1993 [JP] Japan .................................. 5-150071

[51] Int. Cl.$^6$ .......................... H03K 3/42; H03K 17/78
[52] U.S. Cl. ..................... 327/514; 327/102; 327/165; 327/77; 250/214 C
[58] Field of Search ........................... 250/214 C, 214 A, 250/214 B; 307/551, 311; 327/77, 78, 102, 165, 310, 514, 560

[56] References Cited

U.S. PATENT DOCUMENTS

| | | | |
|---|---|---|---|
| 4,139,767 | 12/1979 | Witkowicz | 250/214 A |
| 4,714,828 | 12/1987 | Bacou et al. | 250/214 C |
| 4,733,398 | 3/1988 | Shibagaki et al. | 250/205 |
| 4,891,519 | 1/1990 | Nohira et al. | 250/214 C |
| 4,994,692 | 2/1991 | Wolke | 327/78 |
| 5,047,667 | 9/1991 | Howie | 327/71 |
| 5,247,211 | 9/1993 | Sakura | 307/311 |
| 5,371,763 | 12/1994 | Ota et al. | 327/72 |

FOREIGN PATENT DOCUMENTS

58-114637A  7/1983  Japan .

*Primary Examiner*—Timothy P. Callahan
*Assistant Examiner*—Terry L. Englund
*Attorney, Agent, or Firm*—Nixon & Vanderhye

[57] ABSTRACT

A pulse light-receiving circuit includes a pair of preamplifiers made up of the same circuit components, a difference amplifier for amplifying the outputs from the preamplifiers, and a pair of peak value-detecting circuits made up of the same circuit component for obtaining the amplitude of an input pulse signal. The median of that amplitude is used as a reference voltage for comparison with an output from the difference amplifier.

6 Claims, 10 Drawing Sheets

PULSE LIGHT-RECEIVING CIRCUIT WITH MEANS TO MINIMIZE POWER SOURCE NOISE

BACKGROUND OF THE INVENTION (1) Field of the Invention

The present invention relates to a pulse light-receiving circuit wherein light pulse signal is received, photoelectrically converted and shaped into an electric signal.

(2) Description of the Prior Art

Figure 1:
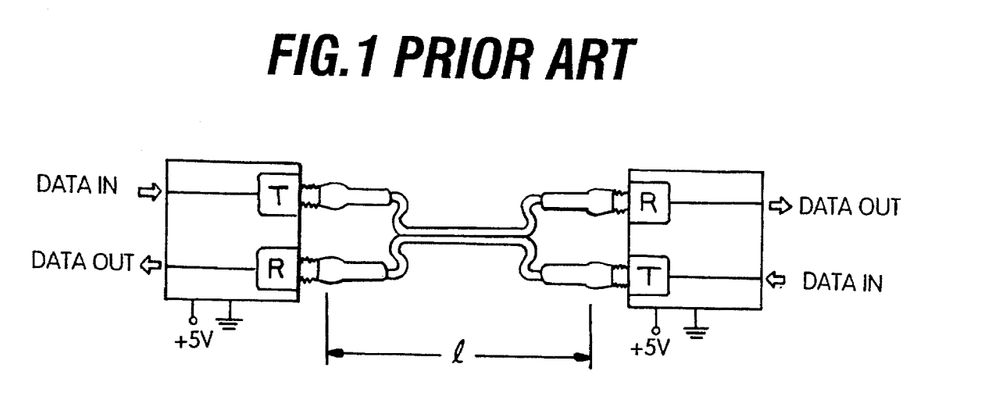
FIG. 1 is a schematic illustrative view showing a prior art linking configuration of an optical fiber system.

A typical example of a prior art optical fiber system linking configuration is shown in FIG. 1 in which a 50M Baud TTL linking arrangement is schematically illustrated. In this system, a pair of apparatus each made up of a transmitting device T and a receiving device R are disposed in a distance 1 apart from one another and input and output of the data is effected through the linking arrangement.

Figure 2:
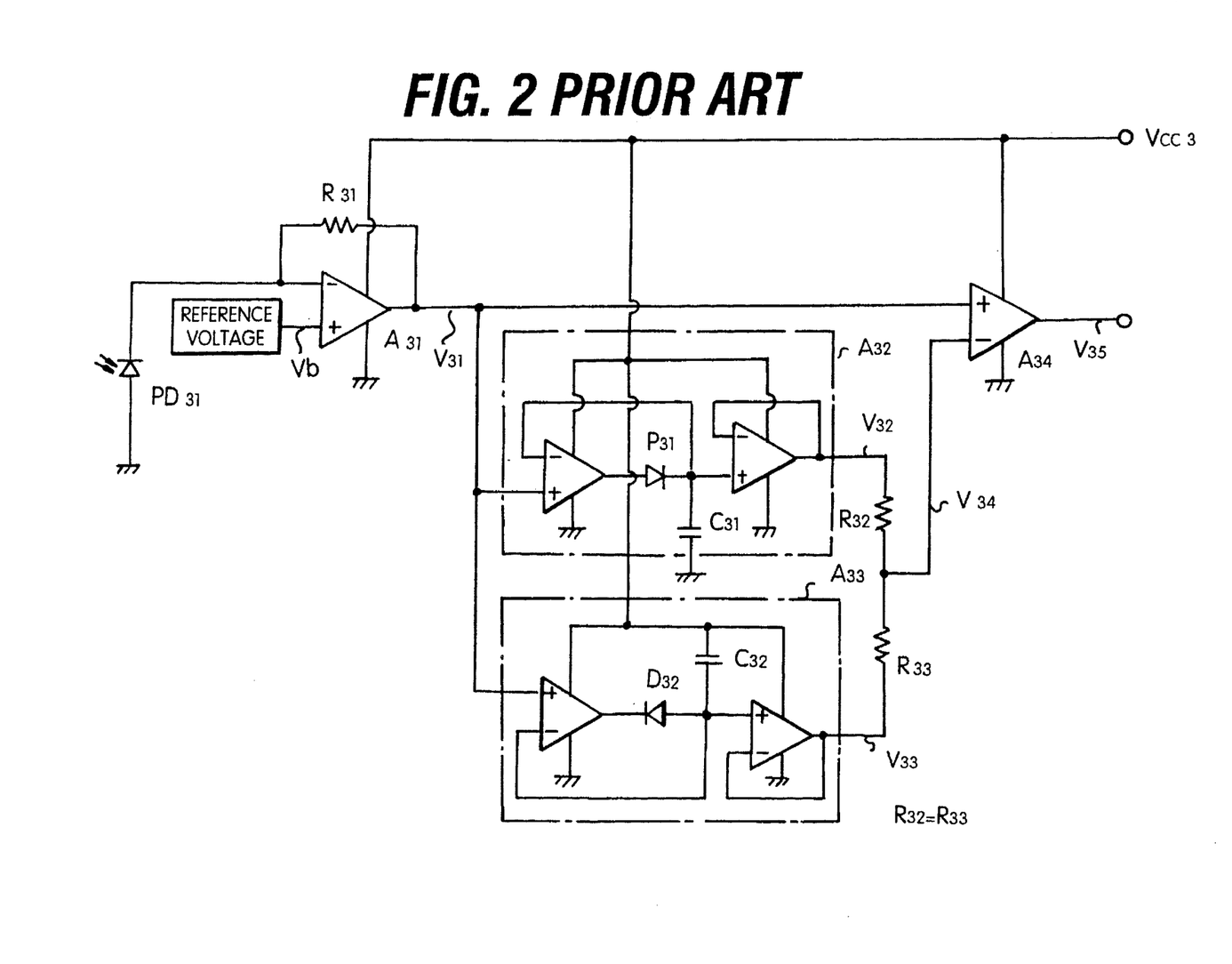
FIG. 2 is a circuit diagram showing an example of a prior art pulse light-receiving circuit.

Of these components, the receiving device the present invention. FIG. 2 shows a prior art example one of such receiving device which includes a single preamplifier $A_{31}$ and further includes a peak-holding circuit $A_{32}$ for holding a positive peak value $V_{31}$ of the output from the preamplifier $A_{31}$ and a bottom-holding circuit $A_{33}$ which is constructed with the polarities thereof inverted relative to those in the peak-holding circuit $A_{32}$, so that a peak-to-bottom value of the pulse (or pulse amplitude) can be obtained. The thus obtained peak- to-bottom value is used as a reference value and compared at a comparator $A_{34}$ to an output voltage from the preamplifier $A_{31}$.

Figure 3:
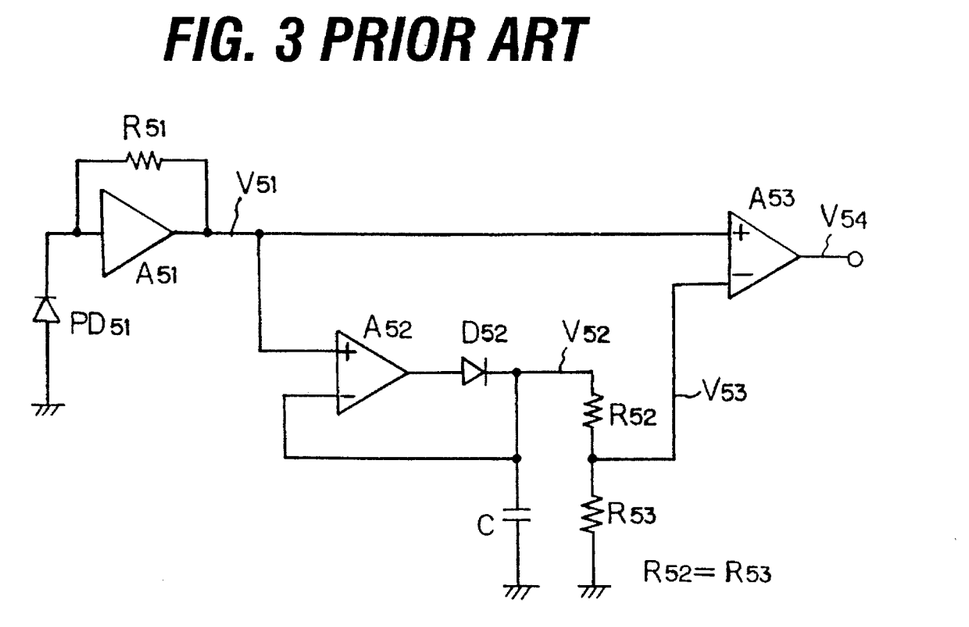
FIG. 3 is another circuit diagram showing an example of a prior art pulse light-receiving circuit.

Another prior art example is shown in FIG. 3. In this figure, designated at $A_{51}$ is a preamplifier, which is connected to a noninverting input terminal of a comparator $A_{53}$. Here, reference numeral $A_{52}$ designates an amplifier with a negative feed back connection made through a diode $D_{52}$. A cathode of the diode $D_{52}$ is grounded by way of a capacitor C. The diode $D_{52}$ is connected by way of a resistor $R_{52}$ to an inverting input terminal of a comparator $A_{53}$. In this arrangement, the comparator $A_{53}$ compares the output value from the preamplifier $A_{51}$ with a half of the peak value outputted from the same preamplifier $A_{51}$.

Figure 4A:
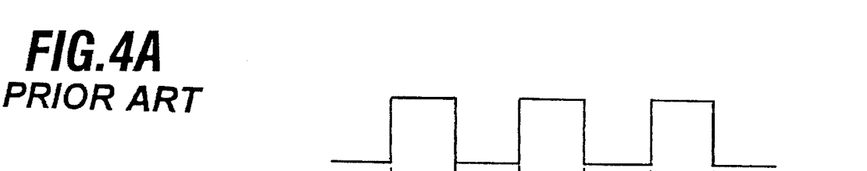
FIG. 4A is a chart showing a waveform of pulse light inputted to the circuit shown in FIG. 2.
Figure 4B:
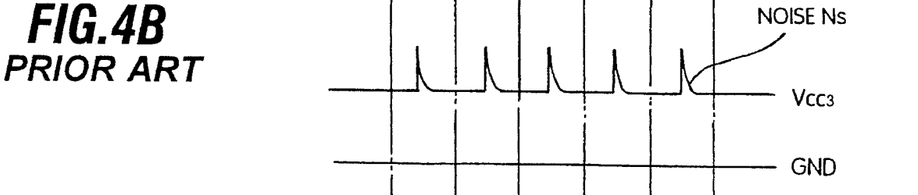
FIG. 4B is a chart showing a waveform of a power supply noise in the circuit shown in FIG. 2.
Figure 4C:
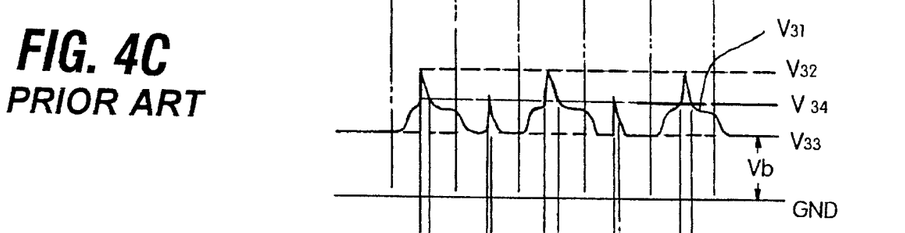
FIG. 4C is a chart showing a waveform in which voltages $V_{31}$ through $V_{34}$ at different points in the circuit shown in FIG. 2 are specified.
Figure 4D:
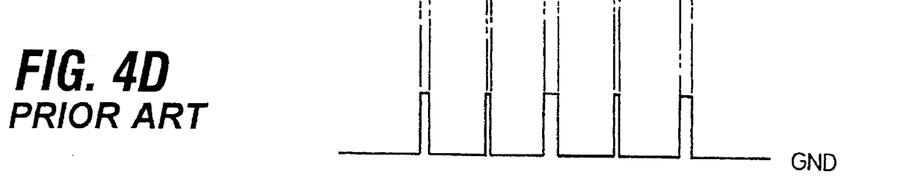
FIG. 4D is a chart showing a waveform of a final voltage $V_{35}$ in the circuit shown in FIG. 2.

In the conventional example previously shown in FIG. 2, if an inphase noise Ns such as power supply noises arises, the peak value of the noise Ns may be held. This would cause the reference value for the comparator $A_{34}$ to be shifted as is shown in FIG. 4C, giving rise to a problem that comparator $A_{34}$ will not respond to a real input signal to which a response should be made.

Further, the peak hold circuit $A_{32}$ differs from the bottom hold circuit $A_{33}$ in that these circuits are not perfectly symmetrical. Therefore, the conventional system suffers from a problem that if the system is affected by power supply noise, the system cannot completely compensate for the influence of that noise.

Figure 5A:
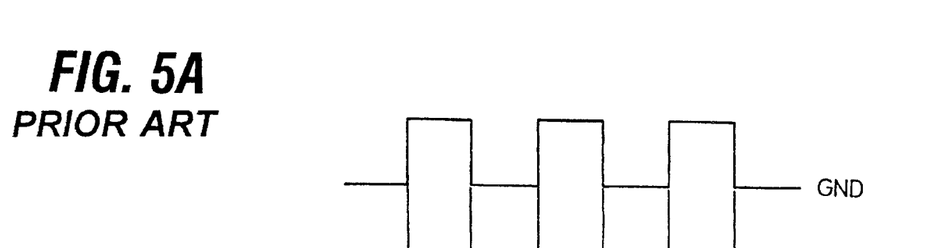
FIG. 5A is a chart showing a waveform of pulse light inputted to the circuit shown in FIG. 3.
Figure 5B:
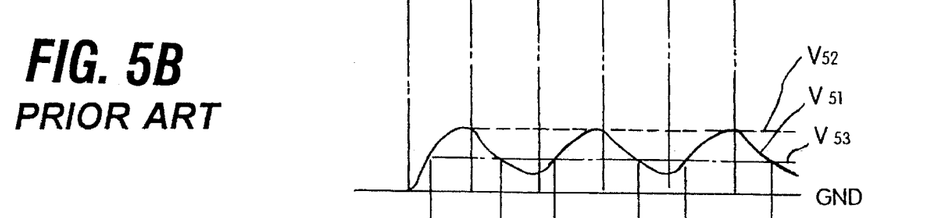
FIG. 5B is a chart showing a waveform in which voltages $V_{51}$ through $V_{53}$ in different points in the circuit shown in FIG. 3 are specified.
Figure 5C:
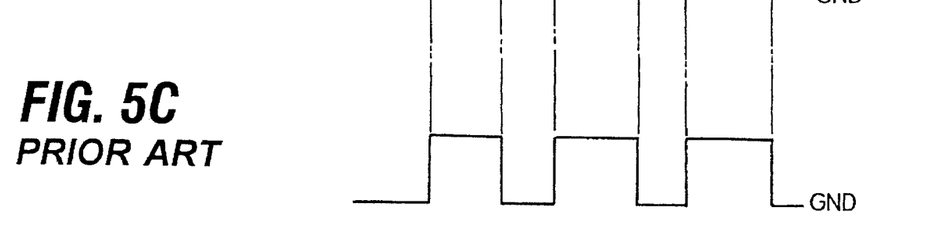
FIG. 5C is a chart showing a waveform of a final voltage $V_{54}$ in the circuit shown in FIG. 3.

Moreover, in the circuit of the prior art example shown in FIG. 3, half of the peak value of the output from the preamplifier $A_{51}$ is compared with the output of $A_{51}$. Therefore, if an input pulse light having a duty ratio of 50% has an increased frequency as shown in FIGS. 5A to 5C, the response of the output $V_{51}$ from the preamplifier $A_{51}$ does not follow the input pulse exactly, as shown in FIG. 5B.

In this case, the bottom value of the output from the preamplifier $A_{51}$ is not reduced to a non-signal level, and the potential level of the comparative reference voltage $V_{53}$ for the comparator $A_{53}$ does not agree with a potential level corresponding to a median amplitude of the output of $A_{51}$. Therefore, the waveform of the output $V_{54}$ from the comparator $A_{53}$ is distorted from a duty ratio of 50%.

On the other hand, Japanese Patent Application Laid-Open Sho 58 No.114637 discloses a publicly known prior art example of light pulse receivers. Peak and minimum values of a pulse signal are obtained by a peak value-holding circuit and a minimum value-holding circuit, respectively so as to yield an amplitude of the pulse signal from the difference. Then, a half of the pulse amplitude is used as a reference value for a comparator in order to compare the original pulse signal therewith. In this configuration, however, the peak value-holding circuit and the minimum value-holding circuit are different circuits. As a result, in the presence of noise such as power supply noise, these circuits hold a peak value and a minimum value of the noise. This method therefore suffers from a drawback that the reference value used in the comparator erroneously set by that noise.

SUMMARY OF THE INVENTION

In view of the above problems, it is an object of the present invention to provide a pulse light-receiving circuit in which the influence of power supply noise is eliminated and distortion of pulse signals having a duty ratio of 50% is prevented.

A first aspect of the present invention resides in that a pulse light-receiving circuit wherein pulse light is received, photoelectrically converted, amplified and shaped in its waveform so as to output a electric pulse signal, comprises: a difference amplifier having two output terminals, one for positive output (non-inverting output) and one for negative output (inverting output); a first peak value-holding circuit for holding a peak value of the positive output from the difference amplifier; a second peak value-holding circuit for holding a peak value of the negative output from the difference amplifier; means for calculating a median value of the amplitude of the positive output from the difference amplifier based on the output voltages obtained from the first peak value-holding circuit and the second peak value-holding circuit; and a comparator comparing the positive output from the difference amplifier with the calculated value.

By this arrangement, the noninverting output and the inverting output from the difference amplifier are held at their respective peak signal values so as to obtain a peak-to-peak value (pulse amplitude) of the pulse signal. The voltage having half of the pulse amplitude value is used as a reference voltage to be compared to the original signal. By this configuration, it is possible to realize a pulse light-receiving circuit which has a high processing speed and excellent resistance to power source noise.

A second aspect of the present invention lies in that a pulse light-receiving circuit comprises: a first light-receiving element photoelectrically converting pulse light from the outside to output a current; a first preamplifier amplifying the output current from the first light-receiving circuit; a second light-receiving element isolated from the outside light; a second preamplifier connected to the second light-receiving element and made up of a circuit equivalent to that of the first preamplifier; a difference amplifier amplifying the output difference between the first preamplifier and the second preamplifier; an auxiliary difference amplifier for outputting a reference voltage, made up of a circuit equivalent to that of the difference amplifier, with both input terminals thereof being commonly connected to an output terminal of the second preamplifier; a first peak value-detecting circuit portion for obtaining a first output peak value of the output from a first difference output terminal of the two output terminals of the difference amplifier, the first difference output terminal being connected to the first preamplifier; a second peak value-detecting circuit portion for obtaining a second output peak value of the output from a second difference output terminal of the two output terminals of the difference amplifier, the second difference output terminal being connected to the second preamplifier; a median value calculating means for calculating a median value of maximum and minimum values of the output from the first difference output terminal of the difference amplifier, on the basis of the reference voltage obtained from the auxiliary amplifier, the first output peak value obtained from the first peak value-detecting circuit portion and the second output peak value obtained from the second peak value-detecting circuit portion; and a comparator comparing the median value of maximum and minimum values of the output, calculated in the median value calculating means to the output from the first difference output terminal of the difference amplifier.

A third aspect of the present invention resides in that a pulse light-receiving circuit having the second feature described above includes the median value calculating means comprising: an inverting amplifier inverting the second output peak value obtained from the second peak value-detecting circuit portion relative to the reference voltage from the auxiliary amplifier; and an average value output portion outputting an average value of the inverted value obtained from the inverting amplifier and the first output peak value obtained from the first peak value-detecting circuit portion.

A fourth aspect of the present invention resides in that a pulse light-receiving circuit having the third feature described above includes the average value outputting portion comprising: a high-voltage side resistance connected to the first peak value-detecting circuit portion; and a low-voltage side resistance connected to the inverting amplifier and the resistances having the same characteristics.

In the configuration having the second to fourth features of the present invention, if a noise such as power source noise is mixed in the circuit, the noise appears equally in both preamplifiers connected to respective light-receiving elements. Since difference amplifiers exhibit no amplification to inphase signals, the inphase noise cancels. A peak value of the output from the first difference output terminal of the difference amplifier is held at the first peak value-detecting circuit portion to form the first peak value. Further the second peak value obtained at the second peak value-detecting circuit portion is inverted (so as to hold a bottom value) by the inverting amplifier relative to the reference voltage. These values, or the first peak value and the inverted value are averaged at the average value outputting portion to output an output median value, so that the output from the first difference output terminal of the difference amplifier is compared at the comparator to the output median value. By this method, the threshold level for the comparator as to be a reference for pulse height judgment of the pulse signal can be set at a median level of the amplitude of the output from the first difference output terminal. Accordingly, it is possible to reproduce pulse signals having a pulse duty ratio of 50% and prevent distortion of the pulse.

Next, a fifth aspect of the present invention resides in that a pulse light-receiving circuit having the second feature includes the median value calculating means comprising: a negative-feedback amplifier having a gain of 0.5, connected at a noninverting input terminal thereof with the first peak value-detecting circuit portion and connected at an inverting input terminal thereof with both the second peak value-detecting circuit portion and an output terminal thereof; and a reference voltage adding circuit portion adding the reference voltage obtained from the auxiliary amplifier to the output from the negative-feedback amplifier.

A sixth aspect of the present invention resides in that a pulse light-receiving circuit having the fifth feature described above includes the reference voltage adding circuit portion, being disposed between the noninverting input terminal of the negative-feedback amplifier and the auxiliary difference amplifier, and comprising an adding input portion adding the first output peak value obtained from the first difference output terminal and the reference voltage obtained from the auxiliary amplifier in a ratio of 1:2 and inputting the sum to the noninverting input terminal of the negative-feedback amplifier.

A seventh aspect of the present invention resides in that a pulse light-receiving circuit having the sixth feature described above includes the reference voltage adding circuit portion comprising a buffer amplifier for removing the influences of the negative-feedback amplifier by way of the noninverting input terminal upon the auxiliary amplifier.

In the configuration having the fifth to seventh features of the present invention, a peak value of the output from the first difference output terminal of the difference amplifier is held at the first peak value-detecting circuit portion to form the first peak value while a peak value of the output from the second difference output terminal of the difference amplifier is held at the second peak value-detecting circuit portion to form the second peak value. The difference between the two output peak values is gain-reduced in half at the negative-feedback amplifier. The halved gain of the difference of the two output peak values is added at the reference voltage adding circuit portion with the reference voltage obtained from the auxiliary difference amplifier, so as to calculate an output mesial value of the output from the first difference output terminal of the difference amplifier. Then, the output from the first difference output terminal of the difference amplifier is compared at the comparator to the output median value to reproduce the pulse signal having a pulse duty ratio of 50%. At this time, at the adding input portion, the first output peak value and the reference voltage are added in a ratio of 2:1, and the sum is inputted to the noninverting input terminal of the negative-feedback amplifier, to thereby maintain the ratio of the gain to the reference voltage at 0.5. Influence of the negative-feedback amplifier by way of the noninverting input terminal upon the auxiliary difference amplifier is removed by the buffer amplifier.

DESCRIPTION OF THE PREFERRED EMBODIMENTS

Figure 6:
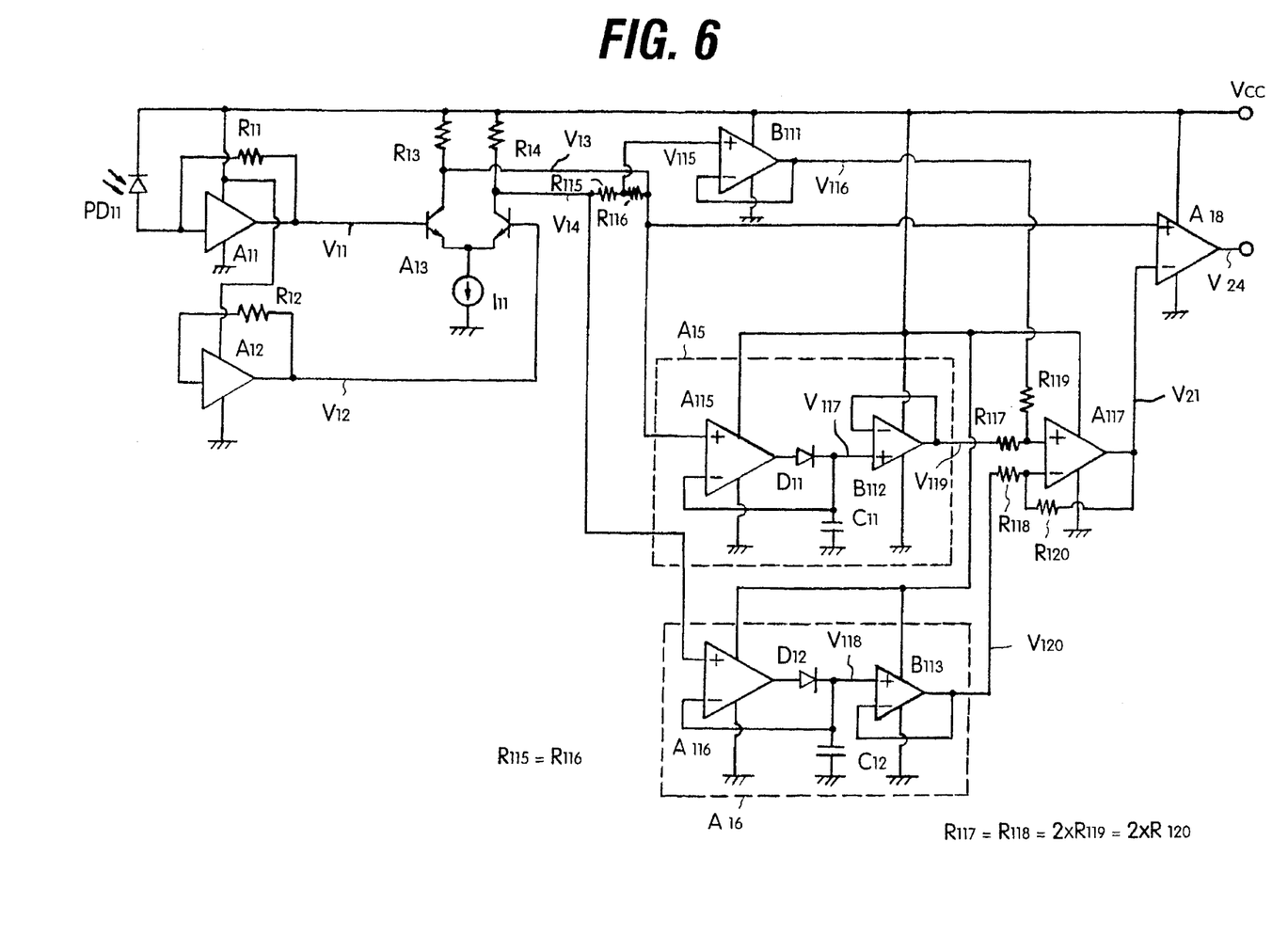
FIG. 6 is a circuit diagram showing an embodiment of a pulse light-receiving circuit of the present invention.

Referring to FIG. 6, one embodiment of a pulse light-receiving circuit of the present invention will be described. In FIG. 6, $PD_{11}$ designates a light-receiving element (a photo-diode) for photoelectrically converting light pulses externally received.

Designated at $A_{11}$ is a first preamplifier for amplifying a current output from the light-receiving element $PD_{11}$. The first preamplifier $A_{11}$ is connected at its input terminal with the light-receiving element $PD_{11}$. The input terminal of the first preamplifier $A_{11}$ is connected to an output terminal thereof by way of a feedback resistor $R_{11}$.

Designated at $A_{12}$ is a second preamplifier. An input terminal of the second preamplifier $A_{12}$ is connected to an output terminal thereof by way of a feedback resistor $R_{12}$. This resistor $R_{12}$ has the same resistance as the resistor $R_{11}$ in the first preamplifier $A_{11}$.

Designated at $A_{13}$ is a typical difference amplifier for amplifying a difference between outputs of $A_{11}$ and $A_{12}$, including a pair of transistors of which collectors are both connected to a power supply Vcc by way of resistors $R_{13}$ and $R_{14}$, respectively. Here, the resistors $R_{13}$ and $R_{14}$ have the same resistance.

A first transistor of the pair transistors in the difference amplifier $A_{13}$ is connected at its base terminal to the output terminal of the first preamplifier $A_{11}$. A second transistor of the pair transistors is connected at its base terminal to the output terminal of the second preamplifier $A_{12}$. Emitters of the pair transistors are both connected to a constant current source $I_{11}$. A resistor $R_{116}$ is connected at an intermediate point of the connection between the collector of the first transistor and the resistor $R_{13}$ whereas another resistor $R_{115}$ is connected with an intermediate point of the connection between the collector of the second transistor and the resistor $R_{14}$.

A junction between these resistors $R_{115}$ and $R_{116}$ is connected to a noninverting input terminal of an amplifier $B_{111}$. An output terminal of the amplifier $B_{111}$ is connected to the inverting input terminal of the amplifier $B_{111}$ to form a negative-feedback connection.

Designated at $A_{15}$ is a first peak value-detecting circuit portion (peak-holding circuit) which holds a peak of the output from one of the two output terminals in the difference amplifier $A_{13}$ or the one which is connected to the first preamplifier $A_{11}$, so as to yield a first output peak value (peak-hold value) $V_{119}$. On the other hand, designated at $A_{16}$ is a second peak value-detecting circuit portion (peak-holding circuit) which holds a peak of the output from the other output terminal in the difference amplifier $A_{13}$ so as to yield a second output peak value (peak-hold value) $V_{120}$.

The first peak value-detecting circuit portion $A_{15}$ is composed of a couple of operational amplifier elements $A_{115}$ and $B_{112}$ forming a positive follower, and a positive-peak value-holding circuit made up of a diode $D_{11}$ and a capacitor $C_{11}$ is provided as a closed loop. A noninverting input terminal of the operational amplifier element $A_{115}$ on the input side of the first peak value-detecting circuit portion $A_{15}$ is connected to a middle point (where the voltage is designated by $V_{13}$) between the collector of the first pair transistor and the resistor $R_{13}$ of the difference amplifier $A_{13}$. An inverting input terminal of the $A_{115}$ is connected to a junction between the diode $D_{11}$ and the capacitor $C_{11}$ so as to form a negative-feedback connection. A noninverting input terminal of the operational amplifier element $B_{112}$ on output side of the first peak value-detecting circuit portion $A_{15}$ is connected to a middle point between the diode $D_{11}$ and the capacitor $C_{11}$. An inverting input terminal of $B_{112}$ is connected to an output terminal thereof to form a negative feedback loop.

The second peak value-detecting circuit portion $A_{16}$, like the first peak value-detecting circuit portion $A_{15}$, forms a positive follower with a couple of operational amplifier elements $A_{116}$ and $B_{113}$, and a positive-peak value-holding circuit is provided in the closed loop. Specifically, a noninverting input terminal of the operational amplifier element $A_{116}$ on the input side of the second peak value-detecting circuit portion $A_{16}$ is connected to a middle point (the voltage is $V_{14}$) between the collector of the second pair transistor and the resistor $R_{14}$ in the difference amplifier $A_{13}$. An inverting input terminal of the $A_{116}$ is connected to a junction between a diode $D_{12}$ and a capacitor $C_{12}$, which are equivalent to the diode $D_{11}$ and the capacitor $C_{11}$, respectively, so as to form a negative feedback connection. A noninverting input terminal of the operational amplifier element $B_{113}$ on the output side of the second peak value-detecting circuit portion $A_{16}$ is connected to the middle point between the diode $D_{12}$ and the capacitor $C_{12}$. An inverting input terminal of $B_{113}$ is connected to an output terminal thereof to form a negative feedback loop.

Designated at $A_{117}$ is an inverting amplifier which inverts the first output peak value $V_{119}$ obtained by the first peak value-detecting circuit portion $A_{15}$ relative to a second output peak value $V_{120}$ obtained in the second peak value-detecting circuit portion $A_{16}$. An inverting input terminal of $A_{117}$ is connected via a resistor $R_{118}$ to the output terminal of the second peak value-detecting circuit portion $A_{16}$. The inverting input terminal of the inverting amplifier $A_{117}$ is further connected via a resistor $R_{120}$ with an output terminal thereof to form a negative feedback connection. On the other hand, a noninverting input terminal of $A_{117}$ is connected via a resistor $R_{117}$ to the output terminal of the first peak value-detecting circuit portion $A_{15}$. The noninverting input terminal is further connected via a resistor $R_{119}$ with an output terminal of an amplifier $B_{111}$. In this case, resistors $R_{117}$, $R_{118}$, $R_{119}$ and $R_{120}$ have the following relations:

$$R_{117} = R_{118} = 2 \times R_{119} = 2 \times R_{120}.$$

Designated at $A_{18}$ is a comparator. The comparator $A_{18}$ is supplied at its noninverting input terminal with the output $V_{13}$ as one of the outputs from the difference amplifier $A_{13}$. An inverting input terminal of $A_{18}$ is supplied with an output $V_{21}$ from the inverting amplifier $A_{117}$. The comparator $A_{18}$ compares the output provided from the output terminal that is connected to the first preamplifier $A_{11}$ of the difference amplifier $A_{13}$, with a comparative reference value, namely, a difference between the output of the first peak value-detecting circuit portion $A_{15}$ and the output of the second peak value-detecting circuit portion $A_{16}$.

In the above arrangement, when the first light-receiving element $PD_{11}$ detects a pulse light the light pulse is photoelectrically converted to yield an output current, which in turn is amplified at the first preamplifier $A_{11}$. The output $V_{11}$ from the first preamplifier $A_{11}$ is supplied to the base terminal of the first transistor in the difference amplifier $A_{13}$. On the other hand, output $V_{12}$ will not be generated by the second preamplifier $A_{12}$ except is present. Once, however, occurs a noise, the output $V_{12}$ carrying the noise is provided to the base terminal of the second transistor of the difference amplifier $A_{13}$.

Here, if $V_{11}$ is greater than $V_{12}$, a current flowing through the resistor $R_{13}$ is greater than a current that flows through the resistor $R_{14}$. When $V_{11}$ is equal to $V_{12}$, the current flowing through the resistor $R_{13}$ is equal to the current that flows through the resistor $R_{14}$ ($V_{13}=V_{14}$). In this case, if there is generated a noise in the circuit, both the preamplifiers $A_{11}$ and $A_{12}$ are of the same structure, so that the noise gives equivalent effects on the both elements.

Next, the output $V_{13}$ is supplied to the noninverting input terminal of the comparator $A_{18}$. The output $V_{13}$ is simultaneously supplied to the noninverting input terminal of the operational amplifier element $A_{115}$ on the input side of the first peak value-detecting circuit portion $A_{15}$. Here, when the voltage $V_{13}$ is great, the voltage $V_{13}$ is amplified by the operational amplifier element $A_{115}$ disposed on the input side in the first peak value-detecting circuit portion $A_{15}$. The amplified voltage charges the capacitor $C_{11}$ via the diode $D_{11}$, and the charged potential gives a noninverting input voltage to the operational amplifier $B_{112}$ disposed on the output side. In this case, the peak value is maintained in the capacitor $C_{11}$ for a long period of time.

On the other hand, when the voltage $V_{13}$ becomes low, the output from the operational amplifier element $A_{115}$ on the input side drops down almost to the negative power source voltage to cut off the diode $D_{11}$. Nevertheless, the noninverting input terminal of the operational amplifier $B_{112}$ on the output side is supplied with the peak voltage kept in a prolonged time by the capacitor $C_{11}$. As a result, a peak value of the output from the first peak value-detecting circuit portion $A_{15}$ may be held. On the other hand, the output $V_{14}$ is inputted to the noninverting input terminal of operational amplifier element $A_{116}$ on the input side of the second peak value-detecting circuit portion $A_{16}$. At the instance, a peak value of the output from the second peak value-detecting circuit portion $A_{16}$ is held in the same manner as in the first peak value-detecting circuit portion $A_{15}$. The peak value is then inverted by the inverting amplifier $A_{117}$ in this case.

Thus, the comparative reference voltage $V_{21}$ provided for the comparator $A_{18}$ is set at a voltage level which corresponds to the median point of the pulse amplitude of the output of the difference amplifier $A_{13}$. This allows the comparator $A_{18}$ to reproduce a pulse output having a pulse duty ratio of approximately 50% with reduced distortion of waveform.

Figure 7:
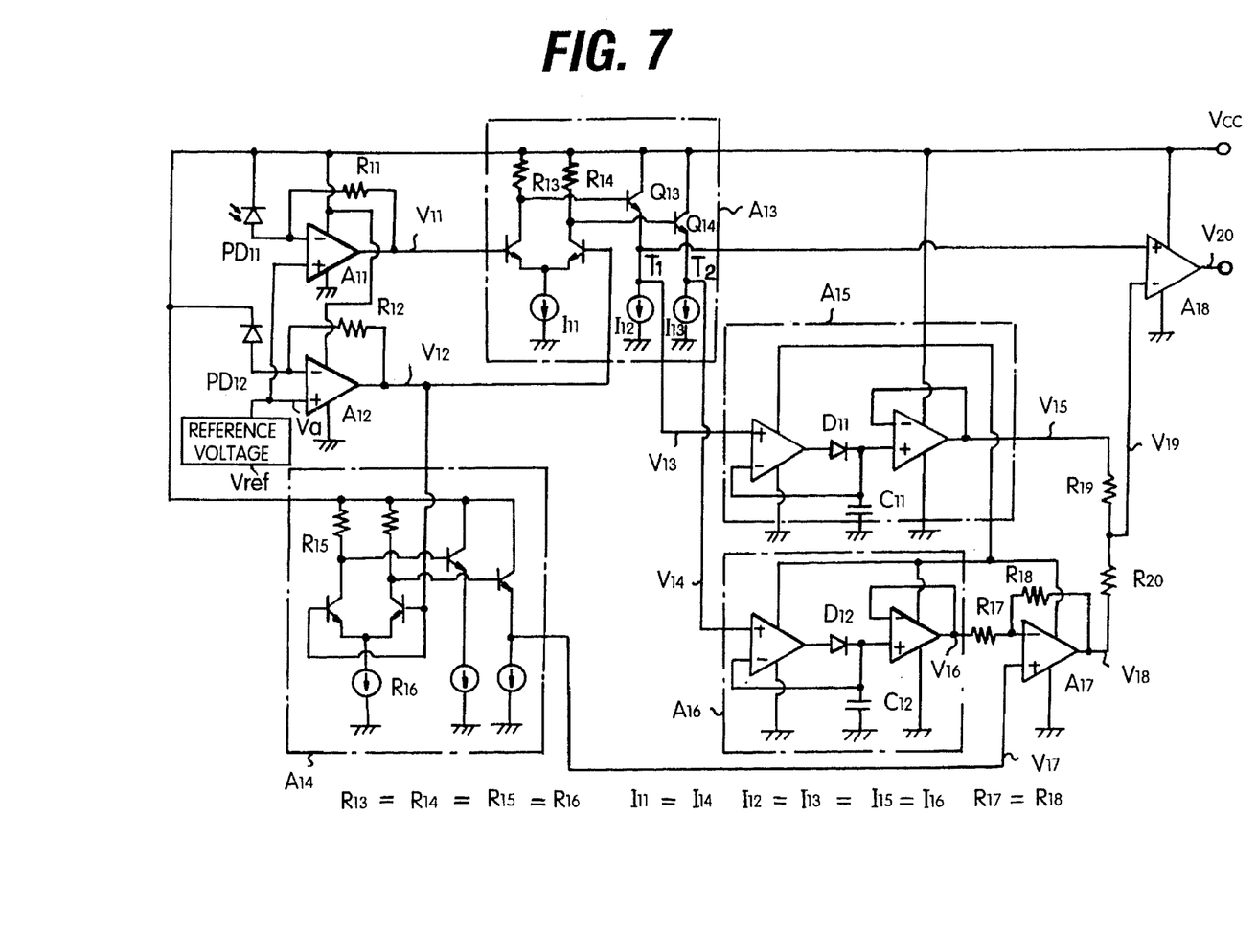
FIG. 7 is a circuit diagram showing another embodiment of a pulse light-receiving circuit of the present invention.

Referring next to FIG. 7, another embodiment of the present invention will be described. In FIG. 7, $PD_{11}$ designates a first light-receiving element (a photo-diode) for photoelectrically converting received light pulses.

Designated at $A_{11}$ is a first preamplifier for amplifying a current output from the first light-receiving element $PD_{11}$. A noninverting input terminal of the first preamplifier $A_{11}$ is connected to a reference voltage source Vref. The first preamplifier $A_{11}$ is connected at its inverting input terminal with the first light-receiving element $PD_{11}$. In addition, the inverting input terminal of the first preamplifier $A_{11}$ is connected to an output terminal thereof by way of a resistor $R_{11}$ to form a negative feedback connection.

$PD_{12}$ designates a second light-receiving element (a photo-diode) which is isolated from any light source so as to serve as a dummy element. Designated at $A_{12}$ is a second preamplifier which is connected to the second light-receiving element $PD_{12}$. The second preamplifier $A_{12}$ is provided so as to conform the output environment of the second light-receiving element $PD_{12}$ to the conditions imposed on the first light-receiving element $PD_{11}$. Accordingly, the second preamplifier $A_{12}$ is connected at its noninverting input terminal with the reference voltage source Vref like the first preamplifier $A_{11}$. An inverting input terminal of $A_{12}$ is connected to the second light-receiving element $PD_{12}$. The inverting input terminal of $A_{12}$ is also connected to an output terminal thereof by way of a resistor $R_{12}$ to form a negative feedback connection. This resistor $R_{12}$ has the same resistance as the resistor $R_{11}$ in the first preamplifier $A_{11}$.

Designated at $A_{13}$ is a typical difference amplifier for amplifying a difference between outputs of $A_{11}$ and $A_{12}$, including a pair of transistors of which collectors are both connected to a power supply Vcc by way of resistors $R_{13}$ and $R_{14}$, respectively. Here, the resistors $R_{13}$ and $R_{14}$ have the same resistance.

A first transistor of the pair transistors in the difference amplifier $A_{13}$ is connected at its base terminal to the output terminal of the first preamplifier $A_{11}$. A second transistor of the pair transistors is connected at its base terminal to the output terminal of the second preamplifier $A_{12}$. Emitters of the pair transistors are both connected to a constant current source $I_{11}$. A middle point of a connection between the collector of the first pair transistor and the resistor $R_{13}$ is connected to the base terminal of a transistor $Q_{13}$. A middle point of a connection between the collector of the second pair transistor and the resistor $R_{14}$ is connected to the base terminal of a transistor $Q_{14}$. Collectors of the transistors $Q_{13}$ and $Q_{14}$ are both connected to a power supply Vcc. Emitters of the transistors $Q_{13}$ and $Q_{14}$ are connected to constant current sources $I_{12}$ and $I_{13}$, respectively.

In addition, in the present embodiment, another auxiliary difference amplifier $A_{14}$ is provided separately from the difference amplifier $A_{13}$. The auxiliary difference amplifier $A_{14}$ outputs a reference voltage $V_{17}$ which is equivalent to the output of the difference amplifier $A_{13}$ when the amplifier $A_{13}$ is provided with no light signal. The auxiliary difference amplifier $A_{14}$ includes resistors $R_{15}$ and $R_{16}$, as shown in FIG. 7, which are equivalent to the resistors $R_{13}$ and $R_{14}$, so as to compose an identical circuit having characteristics totally equivalent to those of the difference amplifier $A_{13}$.

Input terminals of the auxiliary difference amplifier $A_{14}$ are both connected to the output terminal of the second preamplifier $A_{12}$.

Designated at $A_{15}$ is a first peak value-detecting circuit portion (peak-holding circuit) which holds a peak of the output from a terminal of the two output terminals in the difference amplifier $A_{13}$ or a first difference output terminal T1 which is connected to the first preamplifier $A_{11}$, so as to yield a first output peak value (peak-hold value) $V_{15}$. On the other hand, designated at $A_{16}$ is a second peak value-detecting circuit portion (peak-holding circuit) which holds a peak of the output from the other terminal or a second difference output terminal $T_2$ in the difference amplifier $A_{13}$ so as to yield a second output peak value (peak-hold value) $V_{16}$.

The first peak value-detecting circuit portion $A_{15}$ is composed of a couple of operational amplifier elements forming a positive follower, and a positive-peak value-holding circuit made up of a diode $D_{11}$ and a capacitor $C_{11}$ is provided in the closed loop. A noninverting input terminal of one of the operational amplifier elements which is on the input side of the first peak value-detecting circuit portion $A_{15}$ is connected to an emitter (the voltage is $V_{13}$) of the transistor $Q_{13}$ in the difference amplifier $A_{13}$. An inverting input terminal of the same operational amplifier element is connected to a junction between the diode $D_{11}$ and the capacitor $C_{11}$ so as to form a negative feedback connection. On the other hand, a noninverting input terminal of the other operational amplifier element which is on the output side of the first peak value-detecting circuit portion $A_{15}$ is connected to a middle point between the diode $D_{11}$ and the capacitor $C_{11}$. An inverting input terminal of the same operational amplifier element is connected to an output terminal thereof to form a negative feedback loop.

The second peak value-detecting circuit portion $A_{16}$, like the first peak value-detecting circuit portion $A_{15}$, is composed of a couple of operational amplifier elements forming a positive follower, and a positive peak value holding circuit is provided in the closed loop. Specifically, a noninverting input terminal of one of the operational amplifier elements which is on the input side is connected to an emitter (the voltage is $V_{14}$) of the transistor $Q_{14}$ in the difference amplifier $A_{13}$. An inverting input terminal of the same operational amplifier element is connected to a junction between the diode $D_{12}$ and the capacitor $C_{12}$ that are equivalent to the diode $D_{11}$ and the capacitor $C_{11}$, respectively, so as to form a negative feedback connection. On the other hand, a noninverting input terminal of the other operational amplifier element which is on the output side of the second peak value-detecting circuit portion $A_{16}$ is connected to a middle point between the diode $D_{12}$ and the capacitor $C_{12}$. An inverting input terminal of the same operational amplifier element is connected to an output terminal thereof to form a negative feedback loop.

Designated at $A_{17}$ is an inverting amplifier which inverts the second output peak value $V_{16}$ obtained by the second peak value-detecting circuit portion $A_{16}$ relative to the reference voltage $V_{17}$ outputted from the auxiliary difference amplifier $A_{14}$. An inverting input terminal of $A_{17}$ is connected via a resistor $R_{17}$ to the output terminal of the second peak value-detecting circuit portion $A_{16}$. On the other hand, a noninverting input terminal of $A_{17}$ is supplied with the output voltage $V_{17}$ from the auxiliary difference amplifier $A_{14}$. This output voltage $V_{17}$ serves as the inversion reference voltage for the inverting amplifier $A_{17}$. Here, the inverting input terminal of $A_{17}$ is further connected by way of a resistor $R_{18}$ to an output terminal of the inverting amplifier $A_{17}$ to form a negative feedback connection.

$R_{19}$ and $R_{20}$ designate resistors that serve as an average outputting portion for providing an average value of an inverted value (bottom hold value) $V_{18}$ obtained in the inverting amplifier $A_7$ and the first output peak value $V_{15}$ obtained in the first peak value-detecting circuit portion $A_{15}$. These resistors are disposed in series between the output terminal (potential $V_{15}$) of the first peak value-detecting circuit portion $A_{15}$ and the output terminal (potential $V_{18}$) of the inverting amplifier $A_{17}$. Here, the two resistors $R_{19}$ and $R_{20}$ have the same characteristics, and the average value $V_{19}$ obtained by the resistors $R_{19}$ and $R_{20}$ is given by $V_{19}=(V_{15}-V_{18})/2+V_{18}$. Thus, the resistors $R_{19}$ and $R_{20}$ and the inverting amplifier $A_{17}$ constitute a median value calculating means which provides a median of the amplitude of the output $V_{13}$ (a voltage level that corresponds to the medial point of variation of the output) from the first difference output terminal T1 in the difference amplifier $A_{13}$, on the basis of the reference voltage $V_{17}$ obtained in the auxiliary difference amplifier $A_{14}$, the first output peak value $V_{15}$ obtained in the first peak value-detecting circuit portion $A_{15}$ and the second output peak value $V_{16}$ obtained in the second peak value-detecting circuit portion $A_{16}$.

Designated at $A_{18}$ is a comparator. The comparator $A_{18}$ is supplied at its noninverting input terminal with the first output $V_{13}$ as one of the outputs of the difference amplifier $A_{13}$. More specifically, the emitter voltage $V_{13}$ of the transistor $Q_{13}$ on the first preamplifier $A_{11}$ side. An inverting input terminal of $A_{18}$ is supplied with the output average value $V_{19}$ of the output $V_{15}$ of the first peak value-detecting circuit portion $A_{15}$ and the output $V_{18}$ of the inverting amplifier $A_{17}$. The comparator $A_{18}$ compares the output provided from the output terminal that is connected to the first preamplifier $A_{11}$ of the difference amplifier $A_{13}$, with a comparative reference value, namely, the average of the output of the first peak value-detecting circuit portion $A_{15}$ and the output of the second peak value-detecting circuit portion $A_{16}$.

In the above arrangement, when the first light-receiving element $PD_{11}$ detects pulse light, the light pulse is photoelectrically converted to yield an output current, which in turn is amplified at the first preamplifier $A_{11}$. The output $V_{11}$ from the first preamplifier $A_{11}$ is supplied to the base terminal of the first transistor in the difference amplifier $A_{13}$. On the other hand, the second light-receiving element $PD_{12}$ is isolated from light, so that the second preamplifier $A_{12}$ will not generate any output except noise. The detected noise is provided to the base terminal of the second transistor of the difference amplifier $A_{13}$.

In this instance, if $V_{11}$ is greater than $V_{12}$, a current flowing through the resistor $R_{13}$ is greater than a current that flows through the resistor $R_{14}$. Accordingly, the base voltage of the transistor $Q_{13}$ drops as compared with the base voltage of the transistor $Q_{14}$. When $V_{11}$ is equal to $V_{12}$, the current flowing through the resistor $R_{13}$ is equal to the current that flows through the resistor $R_{14}$ ($V_{13}=V_{14}$). In this case, if there is generated a noise in the circuit, the noise gives equivalent effects on both elements because both the preamplifiers $A_{11}$ and $A_{12}$ are of the same structure.

Next, the output $V_{13}$ of the transistor $Q_{13}$ is supplied to the noninverting input terminal of the comparator $A_{18}$. The output $V_{13}$ of the transistor $Q_{13}$ is simultaneously supplied to the noninverting input terminal of the operational amplifier element on the input side of the first peak value-detecting circuit portion $A_{15}$. Here, when the voltage $V_{13}$ is great, the voltage $V_{13}$ is amplified by the operational amplifier element on the input side in the first peak value-detecting circuit portion $A_{15}$. The amplified voltage charges the capacitor $C_{11}$ via the diode $D_{11}$, and the charged voltage gives a noninverting input voltage to the operational amplifier on the output side. In this case, the peak value is maintained in the capacitor $C_{11}$ for a long period of time.

On the other hand, when the voltage $V_{13}$ becomes low, the output of the operational amplifier element on the input side falls down near to the negative power source voltage to cut off the diode $D_{11}$. Nevertheless, the noninverting input terminal of the operational amplifier on the output side is supplied with the peak voltage kept in a prolonged time by the capacitor $C_{11}$. As a result, a peak value of the output from the first peak value-detecting circuit portion $A_{15}$ is held. On the other hand, the output $V_{14}$ from the transistor $Q_{14}$ is inputted to the noninverting input terminal of the operational amplifier element on the input side of the second peak value-detecting circuit portion $A_{16}$. At the instance, a peak value of the output from the second peak value-detecting circuit portion $A_{16}$ is held in the same manner as in the first peak value-detecting circuit portion $A_{15}$. The peak value is then inverted by the inverting amplifier $A_{17}$.

In this case, the output voltage $V_{17}$ from the auxiliary difference amplifier $A_{14}$ is used as an inversion-referential voltage for the inverting amplifier $A_{17}$. Since the auxiliary difference amplifier $A_{14}$ is constructed identically with the difference amplifier $A_{13}$, if there occurs a noise, the noise causes an equivalent influence on the two amplifiers. Outputs from the first peak value-detecting circuit portion $A_{15}$ and the inverting amplifier $A_{17}$ are supplied in parallel through respective resistors $R_{19}$ and $R_{20}$ to the inverting input terminal of the comparator $A_{18}$. Here, $R_{19}=R_{20}$, so that the following relation holds: $V_{19}=(V_{15}-V_{18})/2+V_{18}$. Then, the comparator $A_{18}$ compares the voltage $V_{13}$ with the reference voltage $V_{19}$ to judge whether $V_{13}$ is greater or smaller than the reference voltage.

Figure 8A:
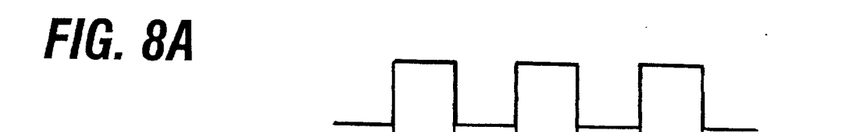
FIG. 8A is a chart showing a waveform of pulse light inputted to the circuit shown in FIG. 7.
Figure 8B:
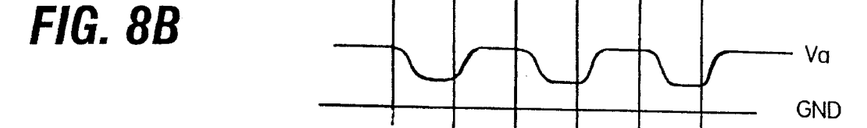
FIG. 8B is a chart showing a waveform of an output of a first preamplifier in the circuit shown in FIG. 7.
Figure 8C:
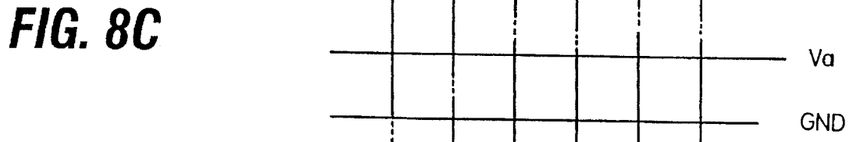
FIG. 8C is a chart showing a waveform of an output of a second preamplifier in the circuit shown in FIG. 7.
Figure 8D:
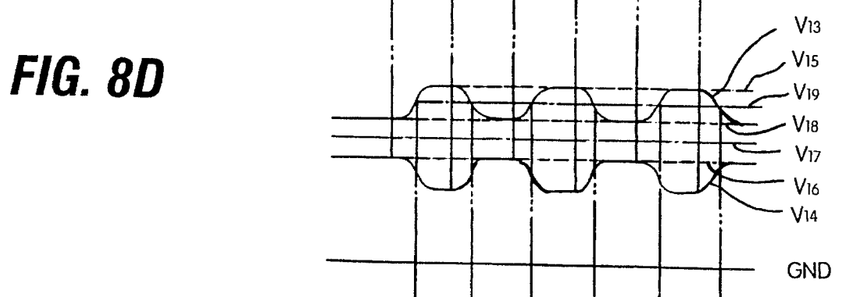
FIG. 8D is a chart showing waveforms in which voltages $V_{13}$ to $V_{19}$ in different points in the circuit shown in FIG. 7 are specified.
Figure 8E:
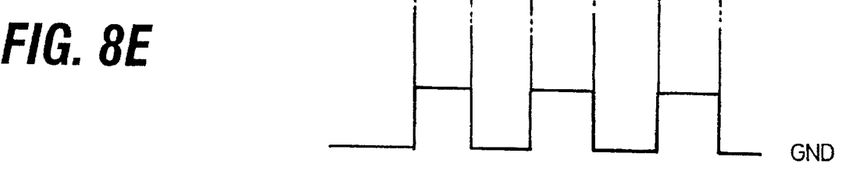
FIG. 8E is a chart showing a waveform of a final voltage $V_{20}$ in the circuit shown in FIG. 7.

FIGS. 8A to 8E show waveforms in different points in the above circuit. FIG. 8A indicates a light input waveform. FIG. 8B shows a waveform of the output $V_{11}$ from the first preamplifier $A_{11}$. FIG. 8C shows a waveform of the output $V_{12}$ from the first preamplifier $A_{12}$. FIG. 8D shows waveforms in which voltages $V_{13}$ to $V_{19}$ in different points and GND level are specified. FIG. 8E shows a waveform of a final output $V_{20}$. As shown in FIGS. 8A to 8E, the comparative reference voltage $V_{19}$ provided for the comparator $A_{18}$ is set at a voltage level which corresponds to the median point of the pulse amplitude of the output of the difference amplifier $A_{13}$. This allows the comparator $A_{18}$, when a pulse signal having a pulse duty ratio of 50% is inputted, to reproduce a pulse output having a pulse duty ratio of approximately 50%. Therefore, it is possible to reduce distortion of waveform.

Figure 9:
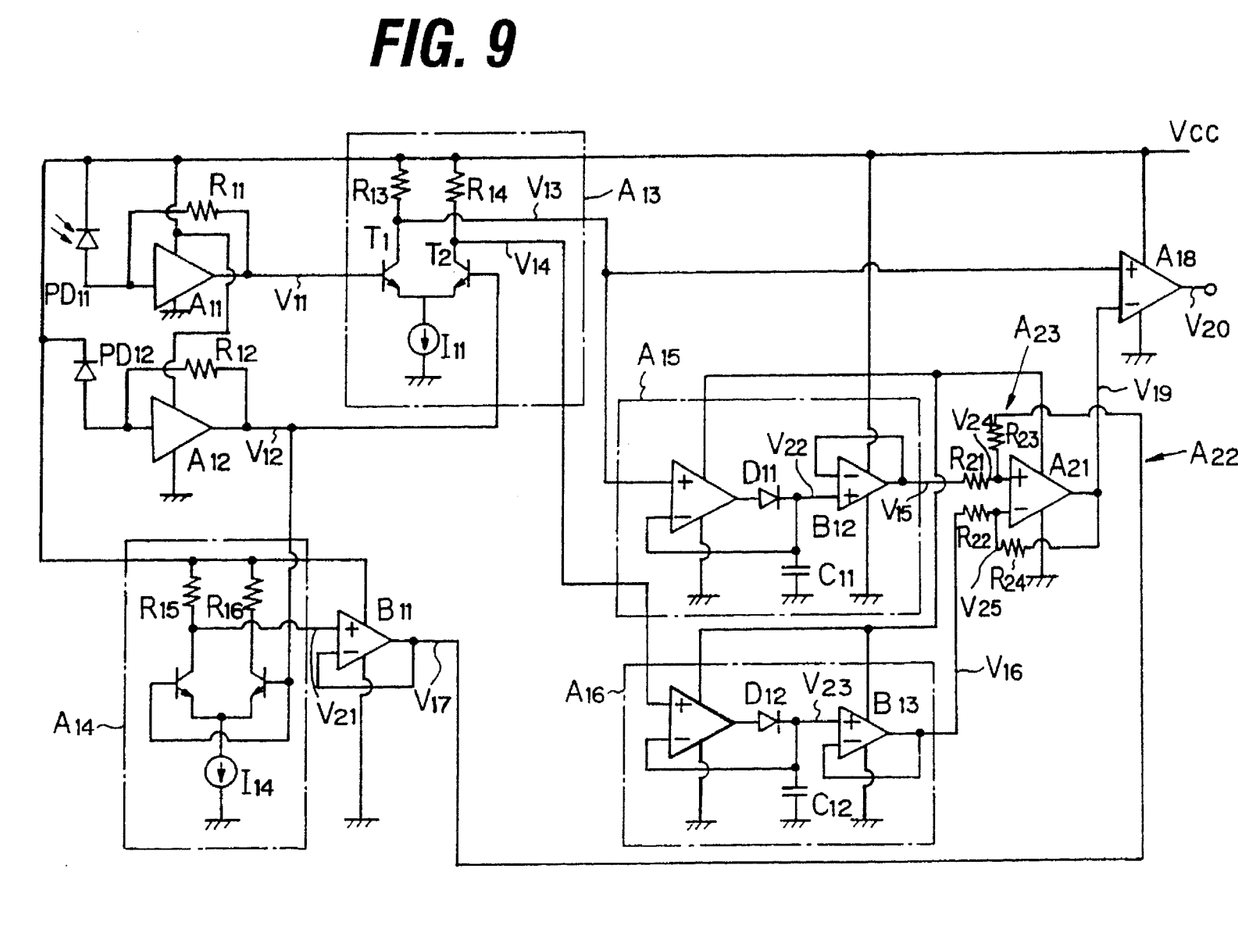
FIG. 9 is a circuit diagram showing still another embodiment of a pulse light-receiving circuit of the present invention.

Next, still another embodiment of the present invention will be shown in FIG. 9.

In the previous embodiment shown in FIG. 7, the output terminal of the first peak value-detecting circuit portion $A_{15}$ is directly to the resistor $R_{19}$ while the output terminal of the second peak value-detecting circuit portion $A_{16}$ is connected to the resistor $R_{20}$ by way of the inverting amplifier $A_{17}$. Therefore, although the two peak value-detecting circuit portions $A_{15}$ and $A_{16}$ have a perfect symmetry, the median value calculating means disposed on their output sides cannot afford a perfect symmetry. For this reason, if an inphase noise occurs, $V_{15}$ and $V_{18}$ could not form signals perfectly opposite to one another, and therefore, it is difficult to offset the noise appearing on the positive side against that appearing on the negative side. The embodiment of the present invention described hereinafter is to substantially perfectly balance the noise appearing on the positive side against that appearing on the negative side. This embodiment includes, as shown in FIG. 9, a first light-receiving element $PD_{11}$ and a first preamplifier $A_{11}$ for amplifying a photoelectric current outputted from the first light-receiving element $PD_{11}$. The circuit further includes a second light-receiving element (dummy element) $PD_{12}$ which has the same structure as of the first light-receiving element $PD_{11}$ or a different structure but a PN-junction producing the same capacity and which is isolated from light from the outside. There is provided also a second preamplifier $A_{12}$ which is identical with the first preamplifier $A_{11}$, a difference amplifier $A_{13}$ for amplifying a difference between an output from the first preamplifier $A_{11}$ and an output from the second preamplifier $A_{12}$. Here, the difference amplifier $A_{13}$ has no negative feedback connection. $A_{14}$ designates an auxiliary amplifier which is formed identically with the difference amplifier $A_{13}$, and is connected to a constant current source $I_{14}$ which is identical with a constant current source $I_{11}$ for the difference amplifier $A_{13}$. Resistors $R_{15}$ and $R_{16}$ which are connected to respective collectors of pair transistors are identical with each other, and equivalent to a pair of resistors $R_{13}$ and $R_{14}$ in the difference amplifier $A_{13}$. Both base (input) terminals of the pair transistors in the auxiliary difference amplifier $A_{14}$ are connected in common with the output terminal of the second preamplifier $A_{12}$. A collector (output) terminal of one of the transistors in the auxiliary difference amplifier $A_{14}$ outputs a voltage $V_{21}$ that is the same with the output from the difference amplifier $A_{13}$ when no light signal is inputted to the first light-receiving element $PD_{11}$. Designated at $B_{11}$ is a buffer amplifier (voltage follower circuit) with a negative feedback loop. The buffer amplifier $B_{11}$ is used as a buffering circuit for the output voltage $V_{21}$ from the auxiliary difference amplifier $A_{14}$. Here, if the offset voltage of the voltage follower circuit $B_{11}$ is equal to zero, $V_{21}$ is equal to $V_{17}$. A noninverting input terminal of the voltage follower circuit $B_{11}$ is connected to the collector terminal of one of transistors in the auxiliary difference amplifier $A_{14}$. There are also provided a first peak value-detecting circuit $A_{15}$ and a second peak value-detecting circuit $A_{16}$. The internal structures of these circuits are identical with those used in the second embodiment, therefore, the description on these circuits will be omitted.

Designated at $A_{21}$ is a negative-feedback amplifier for obtaining a difference between an output $V_{15}$ from the first peak value-detecting circuit portion $A_{15}$ and an output $V_{16}$ from the second peak value-detecting circuit portion $A_{16}$. The noninverting input terminal of $A_{21}$ is connected to the first peak value-detecting circuit portion $A_{15}$ and the inverting input terminal of the same is connected to the second peak value-detecting circuit portion $A_{16}$. Here the negative-feedback amplifier $A_{21}$ is provided with an input resistor $R_{22}$ and a negative feedback resistor $R_{24}$ which serve to set up the gain to be 0.5. The relation between the two resistors $R_{22}$ and $R_{24}$ is as follows:

$$R_{22}=2\times R_{24}.$$

By this relation, the output gain of the negative-feedback amplifier $A_{21}$ relative to input is set up as to be 0.5.

There is also provided a reference voltage adding circuit portion $A_{22}$ for adding the reference voltage $V_{17}$ obtained from the auxiliary difference amplifier $A_{14}$ to the output from the negative-feedback amplifier $A_{21}$. The reference voltage adding circuit portion $A_{22}$ includes a lead wire from a noninverting input terminal of the negative-feedback amplifier $A_{21}$ to the auxiliary difference amplifier $A_{14}$ and an adding input portion $A_{23}$ for adding the first output peak value $V_{15}$ from the first difference output terminal T1 and the reference voltage $V_{17}$ obtained from the auxiliary difference amplifier $A_{14}$ in a ratio of 1 : 2 and supplying the sum to the noninverting input terminal of the negative-feedback amplifier $A_{21}$. The reference voltage adding circuit portion $A_{22}$ further includes a buffer amplifier $B_{11}$ for removing the influence of the negative-feedback amplifier $A_{21}$ by way of the noninverting input terminal of $A_{21}$ upon the auxiliary difference amplifier $A_{14}$. The adding input portion $A_{23}$ is composed as seen in FIG. 9 of a resistor $R_{21}$ between the first peak head value-detecting circuit portion $A_{15}$ and the noninverting input terminal of the negative-feedback amplifier $A_{21}$ and a resistor $R_{23}$ disposed between the lead wire as a part of the reference voltage adding circuit portion $A_{22}$ and the noninverting input terminal of the negative-feedback amplifier $A_{21}$. Here, these resistors suffice the following relations:

$$R_{21}=2\times R_{23}$$

$$R_{21}=R_{22}$$

$$R_{23}=R_{24}.$$

Here, among the output $V_{19}$ from the negative-feedback amplifier $A_{21}$, the two output peak values $V_{15}$ and $V_{16}$ and the reference voltage $V_{17}$, a relation generally holds as follows:

$$V_{19}=(R_{24}/R_{22})\times(V_{15}-V_{16})+V_{17}.$$

On the other hand, since $R_{21}=R_{22}=2\times R_{23}=2\times R_{24}$, the gain of the difference amplifier $A_{21}$ is 0.5, and consequently $V_{19}$ can be represented as follows:

$$V_{19}=(V_{15}V_{16})/2+V_{17} \qquad (1).$$

Here, a median value $V_{19}$ calculating means which is constructed by the negative-feedback amplifier $A_{21}$ and the reference voltage adding circuit portion $A_{22}$, determines a median value of the output variation of the output $V_{13}$ from the first difference output terminal T1 of the difference amplifier $A_{13}$, based on the reference voltage $V_{17}$ obtained in the auxiliary difference amplifier $A_{14}$, the first output peak value $V_{15}$ obtained in the first peak value-detecting circuit portion $A_{15}$ and the second output peak value $V_{16}$ obtained in the second peak value-detecting circuit portion $A_{16}$.

Figure 10:
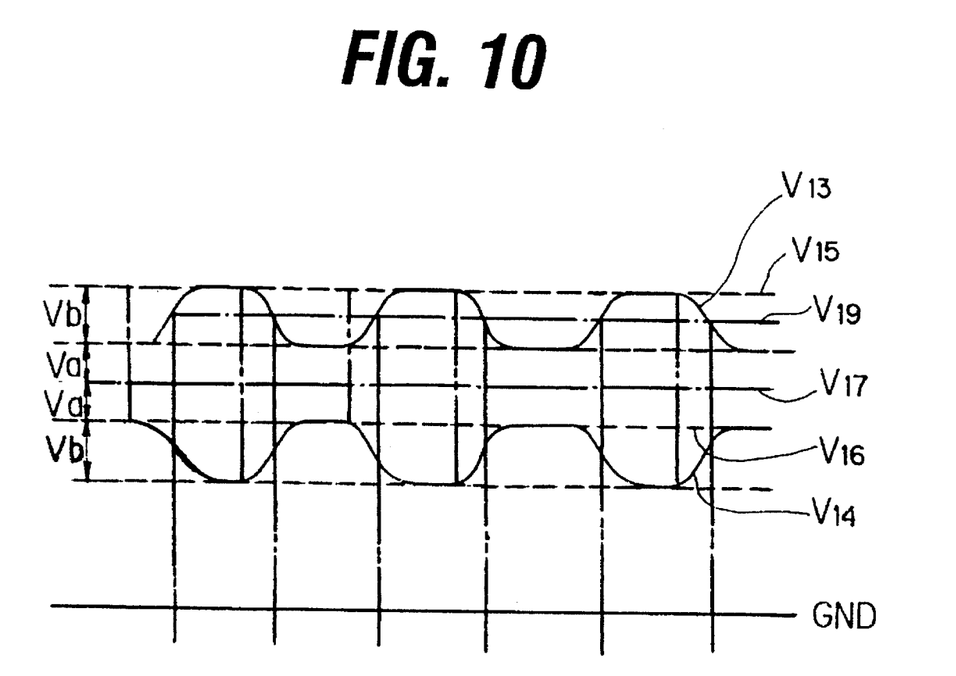
FIG. 10 is a chart showing waveforms in which voltages in different points in the circuit shown in FIG. 9 are specified.

FIG. 10 shows waveforms in different points in the pulse light-receiving circuit thus constructed, when the circuit receives a high frequency pulse light having a duty ratio of 50%. As the frequency of the input pulse light becomes higher, the output response of the difference amplifier $A_{13}$ cannot exactly follow the input pulses. At this time, the bottom value of the output from the difference amplifier $A_{13}$ does not return to the level $V_{17}$ that represents the non-signal state. To deal with this phenomenon, or in order to reduce distortion of output pulses from the comparator $A_{18}$ and make the duty ratio of the output pulse signal close to 50%, it is necessary to compare the output $V_{13}$ from the first difference output terminal of the difference amplifier $A_{13}$ with a median value (a voltage level corresponding to a median amplitude) $V_{19}$ of the variation of the output of the difference amplifier $A_{13}$. Referring now to FIG. 10, consider Va in the following relation with regard to the output $V_{13}$ supplied from one terminal of the difference amplifier $A_{13}$:

$$V_{13}=V_{17}+Va+Vx,$$

and Vb in the following relation with regard to the first output peak value $V_{15}$:

$$V_{15}=V_{17}+Va+Vb.$$

Here, Vx indicates a periodically varying component. As seen in FIG. 10, the second output peak value $V_{16}$ is:

$$V_{16}=V_{17}-Va,$$

so that $$V_{15}-V_{16}=2Va+Vb$$

$$\therefore (V_{15}-V_{16})/2=Va+Vb/2 \qquad (2).$$

Here, $V_{19}$ to be sought can be represented as seen in FIG. 10, $$V_{19}=Va+Vb/2+V_{17} \qquad (3)$$

From (2) and (3), $$V_{19}=(V_{15}-V_{16})/2+V_{17}.$$

This corresponds to the above expression (1). The configuration of this embodiment, without use of an inverting amplifier as used in the second embodiment, compares one of outputs from the difference amplifier $A_{13}$ with reference to the median value $V_{19}$ of the variation of the output of the difference amplifier $A_{13}$ in order to judge whether the output is greater or smaller than the reference voltage. Accordingly, the median value calculating means in the second embodiment does not have a perfect symmetry since no inverting amplifier $A_{17}$ is equipped to the comparator $A_{18}$ on its noninverting input terminal side. In contrast to this, in the present embodiment, the entire circuit including the first peak value-detecting circuit portion $A_{15}$, the second peak value-detecting circuit portion $A_{16}$ and the median value calculating means has a perfect symmetry, so that it is possible to eliminate inphase noises by offsetting the noises on the positive side with the negative side.

It should be noted that the present invention is not limited to the above embodiments described herein, many variations and modifications can of course be made in the above embodiments within a scope of the present invention.

For example, detailed circuit constructions such as of providing voltage-adjustment resistors for various parts of the circuit are not limited to those shown in FIGS. 6, 7 and 9.

As is apparent from the foregoing description, in accordance with the first aspect of the present invention, it is possible for the configuration having the first feature to realize a pulse light-receiving circuit which has a high processing speed and is excellent in resistance to power source noise, by holding at their peaks the noninverting output and inverting output created from an original signal by the difference amplifier so as to obtain a peak-to-minimum value (amplitude value) and comparing the original signal to the half of the obtained amplitude value.

In accordance with the second through fourth aspects of the present invention, an additional light-receiving element isolated from the outside light is provided separately of the first light-receiving element for photoelectric conversion. Output currents from the two light-receiving elements are amplified respectively in different preamplifiers made up of the same circuit components, and the amplified currents are detected respectively in different peak value detecting circuit portions of the same circuit components to form respective peak values. An output median value of the output from one of the terminals of the difference amplifier is calculated based on the two peak values. The comparator compares the output signal height from one output terminal of the difference amplifier with reference to the output median value. Accordingly, inphase noise such as power source noise and the like can be cancelled improving resistance to noise. In addition, even if a pulse signal having a higher frequency is inputted to the pulse light-receiving circuit, the circuit may inhibit the distortion of the output waveform. Especially, in accordance with the embodiments of the third and fourth features of the present invention, it is possible to realize improvement in noise resistance and reduction in distortion of output waveform using a simple configuration.

In accordance with the fifth feature of the present invention, the first peak value-detecting circuit portion is connected to the noninverting input terminal of the negative-feedback amplifier and the second peak value-detecting circuit portion is connected to the inverting input terminal of the same amplifier. Accordingly, the first peak value-detecting circuit portion and the second peak value-detecting circuit portion can be connected keeping perfect symmetry. Therefore, inphase noise may substantially offset each other, or noise signals on the positive and negative sides can offset each other. As a result, it is possible to improve the noise resistance.

Further, in accordance with the sixth feature of the present invention, since the reference voltage adding circuit portion include an adding input portion, by a simple configuration it is possible to add the first output peak value obtained from the first difference output terminal and the reference voltage obtained from the auxiliary difference amplifier in a ratio of 1:2.

In accordance with the seventh feature of the present invention, since the pulse light-receiving circuit is made to include a buffer amplifier, it is possible to remove the influence of the negative-feedback amplifier by way of the noninverting input terminal on the auxiliary amplifier. Accordingly, the reference voltage for calculating an output median value can be detected with precision, whereby the height-determination of the pulse signals is carried out with precision.

What is claimed is:

1. A pulse light-receiving circuit comprising: a first light-receiving element photoelectrically converting a pulse light into an electrical current;

a first preamplifier amplifying the electrical current from said first light-receiving element;

a second light-receiving element shielded from light;

a second preamplifier, connected to said second light-receiving element and made up of a circuit equivalent to that of said first preamplifier for amplifying an output from said second light-receiving element;

a primary difference amplifier amplifying a light-receiving element difference between output signals from said first preamplifier and said second preamplifier;

an auxiliary difference amplifier for outputting a reference voltage, made up of a circuit equivalent to that of said primary difference amplifier, with both input terminals thereof being commonly connected to an output terminal of said second preamplifier;

a first peak value-detecting circuit for obtaining a first peak value of an output from a first difference output terminal of said primary difference amplifier, said first difference output terminal being connected to said first peak value-detecting circuit;

a second peak value-detecting circuit for obtaining a second peak value of an output from a second difference output terminal of said primary difference amplifier, said second difference output terminal being connected to said second peak value-detecting circuit;

a median value calculator for calculating a median value between maximum and minimum values of the output from said first difference output terminal based on the reference voltage, the first peak value, and the second peak value; and a comparator comparing the median value to the output from said first difference output terminal.

2. A pulse light-receiving circuit according to claim 1, wherein said median value calculator comprises:

an inverting amplifier inverting the second peak value relative to the reference voltage from said auxiliary amplifier; and an average value output circuit outputting an average value of the inverted value and the first peak value.

3. A pulse light-receiving circuit according to claim 2, wherein said average value outputting circuit comprises:

a high-voltage side resistance connected to said first peak value-detecting circuit; and a low-voltage side resistance connected to said inverting amplifier, said high voltage and low-voltage side resistances having the same characteristics.

4. A pulse light-receiving circuit according to claim 1, wherein said median value calculator comprises: a negative-feedback amplifier having a gain of 0.5, connected at a noninverting input terminal thereof with said first peak value-detecting circuit and connected at an inverting input terminal thereof with both said second peak value-detecting circuit and an output terminal thereof; and a reference voltage adding circuit adding the reference voltage obtained from said auxiliary amplifier to the output from said negative-feedback amplifier.

5. A pulse light-receiving circuit according to claim 4, wherein said reference voltage adding circuit is disposed between said noninverting input terminal of said negative-feedback amplifier and said auxiliary difference amplifier, and comprises an adding input for summing the first peak value and the reference voltage in a ratio of 1:2 and inputting the sum to said noninverting input terminal of said negative-feedback amplifier.

6. A pulse light-receiving circuit according to claim 5, wherein said reference voltage adding circuit comprises a buffer amplifier for removing an influence of said negative-feedback amplifier by way of said noninverting input terminal on said auxiliary amplifier.

* * * * *